(12) United States Patent
Kimura

(10) Patent No.: US 6,593,243 B1
(45) Date of Patent: Jul. 15, 2003

(54) METHOD OF MANUFACTURING SEMICONDUCTOR DEVICE

(75) Inventor: Hajime Kimura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/632,163

(22) Filed: Aug. 3, 2000

(30) Foreign Application Priority Data

Feb. 16, 2000 (JP) ........................................ 2000-037764

(51) Int. Cl.⁷ ............................................. H01L 21/302
(52) U.S. Cl. ..................... 438/706; 438/710; 438/712
(58) Field of Search ............................... 438/706, 710, 438/711, 712, 257, 259, 261

(56) References Cited

U.S. PATENT DOCUMENTS

| | | | | |
|---|---|---|---|---|
| 5,429,070 A | * | 7/1995 | Campbell et al. | 118/723 |
| 5,472,564 A | * | 12/1995 | Nakamura et al. | 216/51 |
| 5,541,127 A | * | 7/1996 | Hoshiko et al. | 438/585 |
| 5,856,227 A | * | 1/1999 | Yu et al. | 438/305 |
| 5,930,594 A | * | 7/1999 | Villain | 438/52 |
| 6,004,853 A | * | 12/1999 | Yang et al. | 438/305 |
| 6,235,638 B1 | * | 5/2001 | Huang et al. | 438/695 |
| 6,261,934 B1 | * | 7/2001 | Kraft et al. | 438/592 |
| 6,316,166 B1 | * | 11/2001 | Chi et al. | 430/313 |

FOREIGN PATENT DOCUMENTS

| | | |
|---|---|---|
| JP | 5-160081 | 6/1993 |
| JP | 6-275574 | 9/1994 |
| JP | 8-17330 | 1/1996 |

* cited by examiner

Primary Examiner—Benjamin L. Utech
Assistant Examiner—Lan Vinh
(74) Attorney, Agent, or Firm—McDermott, Will & Emery (57) ABSTRACT

A polycrystalline silicon film 2 and tungsten silicide film 3 are formed on a silicon substrate 1. An insulating film to be a hard mask is formed on tungsten silicide film 3. A photoresist pattern 5 is formed on the insulating film. The insulating film is anisotropically etched using photoresist pattern 5 as a mask. By etching the exposed side surface of insulating film 4a in a gas phase hydrofluoric acid ambient, a hard mask 4b is formed. Thus, a mask material with a desired dimension is obtained without causing any variation in thickness of the mask material, and the layer to be the mask material is prevented from coming off the semiconductor substrate.

19 Claims, 8 Drawing Sheets

METHOD OF MANUFACTURING SEMICONDUCTOR DEVICE

BACKGROUND OF THE INVENTION

1. Field of the Invention

The present invention relates to methods of manufacturing semiconductor devices and, more particularly to a method of manufacturing a semiconductor device capable of forming a pattern such as an extremely fine interconnection with accuracy.

2. Description of the Background Art

Interconnections are increasingly becoming smaller in semiconductor devices. Thus, it is becoming difficult to form such extremely fine interconnection patterns only by means of lithography. To meet the requirements for such semiconductor devices, a hard mask including for example a silicon oxide film is applied in place of a photoresist pattern as a mask material.

Figure 13:
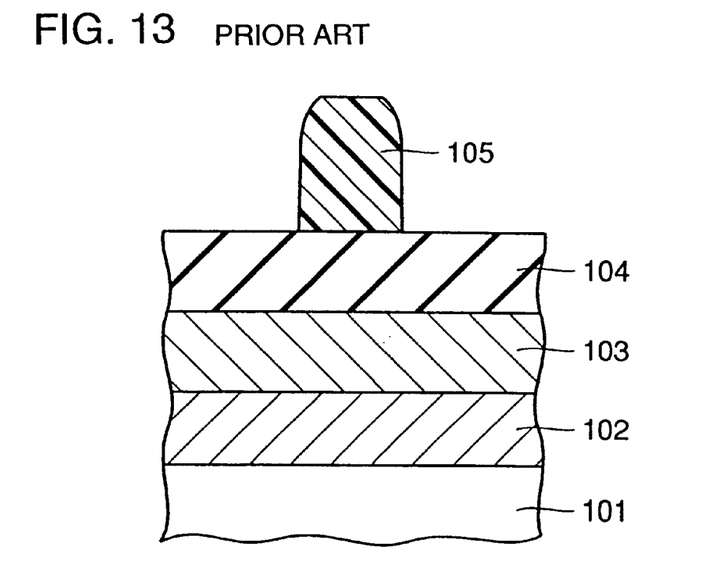
FIG. 13 is a cross sectional view shown in conjunction with a step of a conventional method of manufacturing a semiconductor device.

Now, an exemplary method of manufacturing a semiconductor device using the hard mask will be described with reference to the drawings. Referring to FIG. 13, a polycrystalline silicon film 102 is formed for example by CVD (Chemical Vapor Deposition) on a silicon substrate 101. A tungsten silicide film 103 is formed for example by sputtering on polycrystalline silicon film 102. An insulating film 104, which is to be a hard mask, is formed on tungsten silicide film 103. A prescribed photoresist pattern 105 is formed on insulating film 104.

Figure 14:
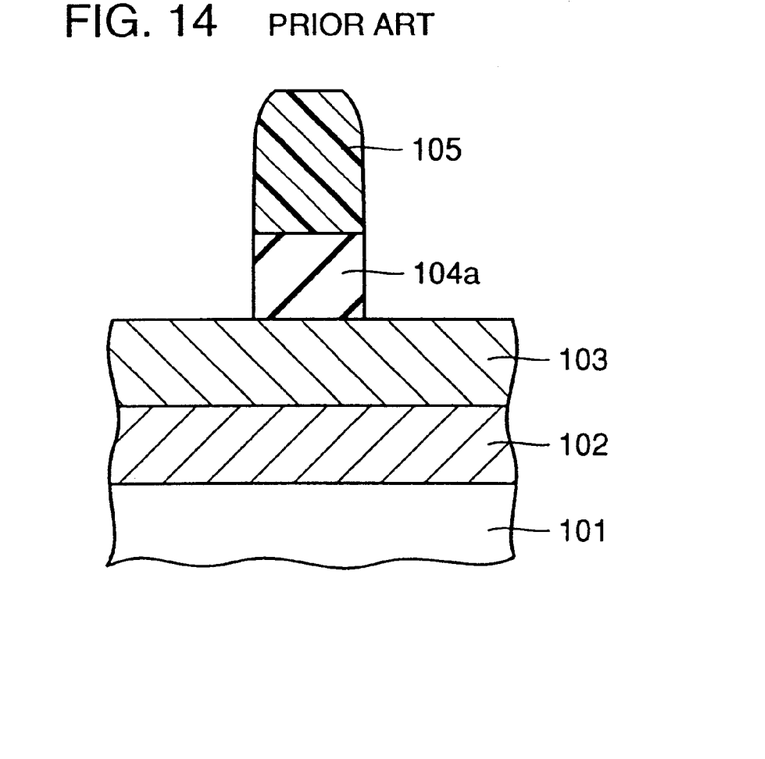
FIGS. 14 and 15 are cross sectional views respectively shown in conjunction with steps performed after the steps shown in FIGS. 13 and 14.

Referring to FIG. 14, by anisotropically etching insulating film 104 using photoresist pattern 105 as a mask, a surface of tungsten silicide film 103 is exposed and insulating film 104a is formed.

Figure 15:
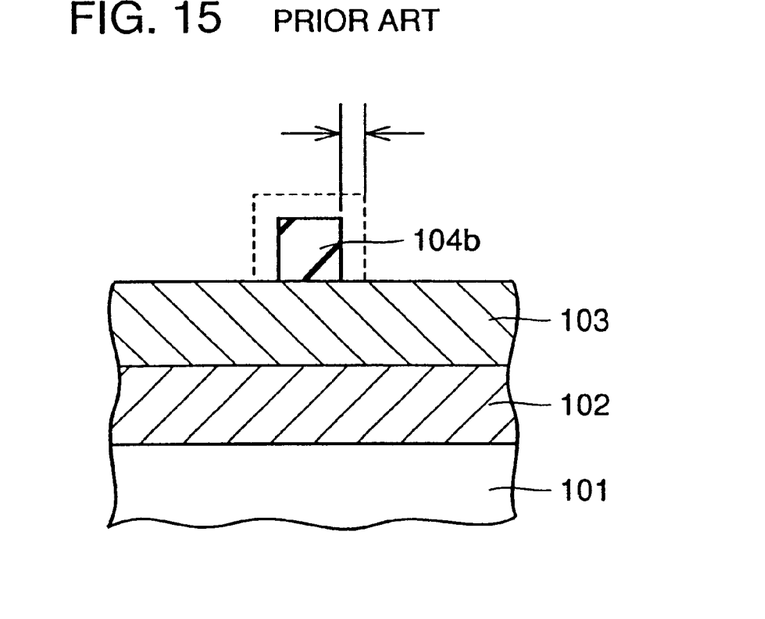

Referring now to FIG. 15, by removing photoresist pattern 105 and isotropically etching insulating film 104a, an insulating film mask (hard mask) 104b is formed having a prescribed dimension.

At the time, for example, if insulating film 104a is a silicon oxide film, a prescribed insulating film mask 104b is formed by isotropically etching insulating film 104a in a hydrofluoric solution.

Then, by anisotropically etching tungsten silicide film 103 and polycrystalline silicon film 102 using insulating film mask 104b as a mask, an interconnection (not shown) having a prescribed dimension is formed. Thus, a semiconductor device is formed having fine interconnections.

As described above, insulating film mask 104b is formed by isotropically etching insulating film 104a. In a semiconductor device or the like in which insulating film mask 104b (hard mask) is ultimately removed after forming a desired interconnection, an extremely thin hard mask may be formed. In this case, to achieve a desired interconnection dimension, control of a thickness of insulating film 104 as the hard mask becomes extremely difficult.

As a result, when an interconnection dimension must be changed to comply with the change of a design rule of a semiconductor device, a thickness of an insulating film as a hard mask must be considered. Accordingly, it becomes extremely difficult to form a desired hard mask.

In addition, when insulating film 104a is isotropically etched in a hydrofluoric solution, insulating films 104a and 104b as hard masks may come off silicon substrate 101. Thus, a desired interconnection cannot be formed.

SUMMARY OF THE INVENTION

The present invention is made to solve the aforementioned problems. An object of the present invention is to provide a method of manufacturing a semiconductor device capable of providing a mask material with a desired dimension without any variation in thickness of the mask material and preventing a layer to be the mask material from coming off a semiconductor substrate.

The method of manufacturing the semiconductor device according to the present invention is provided with the following steps. A prescribed layer is formed on a main surface of a semiconductor substrate. A layer, which is to be used as a mask material when patterning the prescribed layer, is formed thereon. A photoresist pattern is formed on the layer to be the mask material. Using the photoresist pattern as the mask, the layer to be the mask material is etched to form the mask material. The prescribed layer is etched using the mask material as a mask to form a prescribed pattern. In the step of forming the mask material, the layer to be the mask material is etched in a gas phase ambient using the photoresist pattern as the mask.

According to the manufacturing method, in the step of forming the mask material, the layer to be the mask material is etched in the gas phase ambient using the photoresist pattern as the mask. As compared with the case of etching in a liquid phase, the mask material can be formed without causing the layer to be the mask material to come off the semiconductor substrate. In addition, as the layer to be the mask material is covered by the photoresist pattern, a desired mask material can be formed without causing any variation in thickness of the mask material. As a result, by etching the prescribed layer using the mask material as the mask, a prescribed fine pattern can readily be formed with extremely high dimensional accuracy.

More specifically, the step of forming the mask material preferably includes: a first etching step of anisotropically etching the layer to be the mask material to expose a surface of the prescribed layer using the photoresist pattern as the mask; and a second etching step of etching a side surface of the layer to be the mask material positioned under the photoresist pattern in the gas phase ambient to form the mask material.

In this case, the mask material having a desired dimension can be formed with accuracy without causing any decrease in thickness of the layer to be the mask material. Even when the dimension of a prescribed pattern is to be changed to comply with the change in design rule of a semiconductor device, for example, the thickness of the layer to be the mask material needs not be considered.

More preferably, the second etching step includes, a step of removing a polymer film formed on the side surface of the layer to be the mask material in the first etching step.

Removal of the polymer film enables uniform etching in the second etching step to form the mask material with high dimensional accuracy.

More preferably, the step of forming the photoresist pattern includes a step of forming an anti-reflection film as an underlying film, and the second etching step includes a step of etching the exposed side surface of the layer to be the mask material using the anti-reflection film as the mask.

In this case, halation is prevented by the anti-reflection film during exposure, so that a finer photoresist pattern is formed and a fine mask material can readily be formed with high dimensional accuracy.

When a silicon nitride film is applied as the layer to be the mask material, in the second etching step, etching of the layer to be the mask material preferably involves making of a gas including $CF_4$, $O_2$ and $N_2$ into a plasma for etching in the plasma ambient.

Further, a thickness of the layer to be the mask material is smaller than a length over which the layer to be the mask material is etched along the main surface of the semiconductor substrate in the step of forming the mask material. The step of forming the mask material preferably includes the step of forming the mask material by isotropically etching in the gas phase ambient.

In this case, only one isotropic etching enables formation of the mask material.

When the layer to be the mask material includes a silicon oxide film, the gas phase ambient preferably includes hydrofluoric acid (HF) in a gas phase.

Preferably, the prescribed layer is a conductive layer and the prescribed pattern includes an interconnection.

In this case, an interconnection, which is the most highly required to be fine in the semiconductor device, can readily be formed with dimensional accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
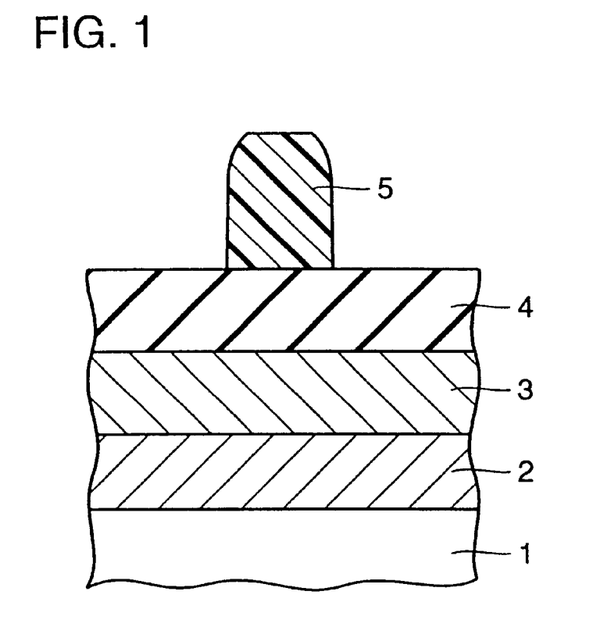
FIG. 1 is a cross sectional view shown in conjunction with a step of a method of manufacturing a semiconductor device according to the first embodiment of the present invention.

A method of manufacturing a semiconductor device according to the first embodiment of the present invention will be described. First, as shown in FIG. 1, a polycrystalline silicon film 2 is formed on a silicon substrate 1 for example by CVD. A tungsten silicide film 3 is formed on polycrystalline silicon film 2 for example by sputtering. An insulating film 4 such as a silicon oxide film which is to be a hard mask is formed on tungsten silicide film 3. A photoresist pattern 5 is formed on insulating film 4.

Figure 2:
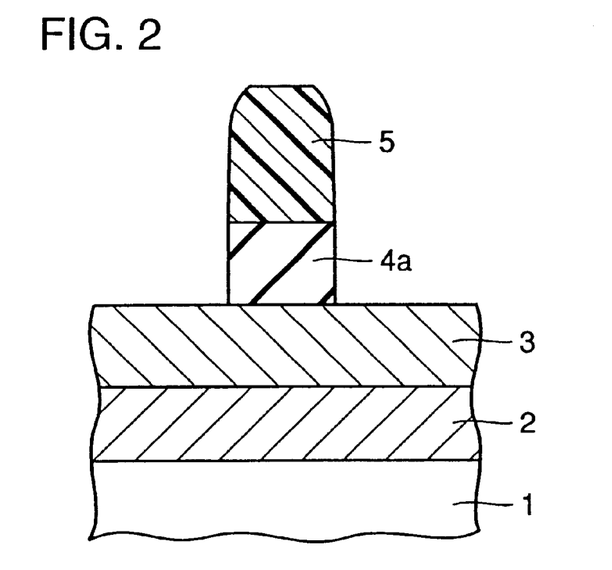
FIGS. 2 to 5 are cross sectional views respectively shown in conjunction with steps performed after the steps shown in conjunction with FIGS. 1 to 4 in the first embodiment of the present invention.

Then, as shown in FIG. 2, by anisotropically etching insulating film 4 using photoresist pattern 5 as a mask by reactive ion etching using a mixture gas including $CHF_3$, $CF_4$ and Ar under a pressure of for example 2 Pa to 30 Pa, the surface of tungsten silicide film 3 is exposed and insulating film 4a is formed.

Figure 3:
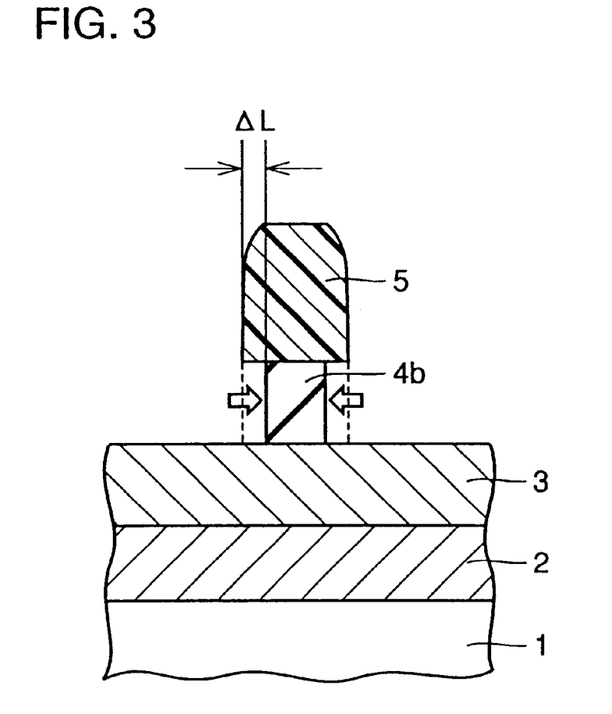

Then, as shown in FIG. 3, by etching (ΔL) the exposed side surface of insulating film 4a using photoresist pattern 5 as a mask in an ambient of a gas phase hydrofluoric acid (HF) with a vapor steam (in an amount of several %), a hard mask 4b is formed having a desired dimension.

Figure 4:
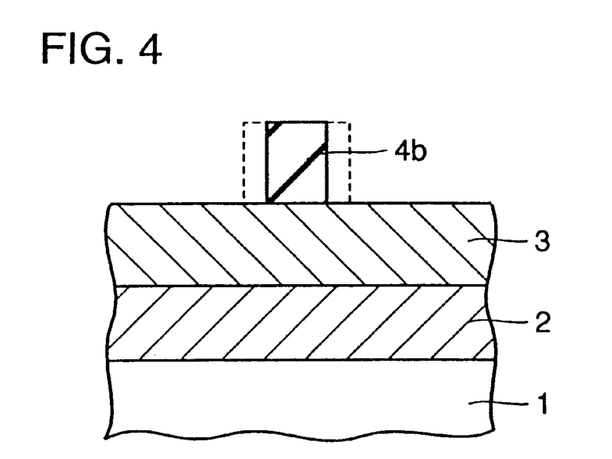
Figure 5:
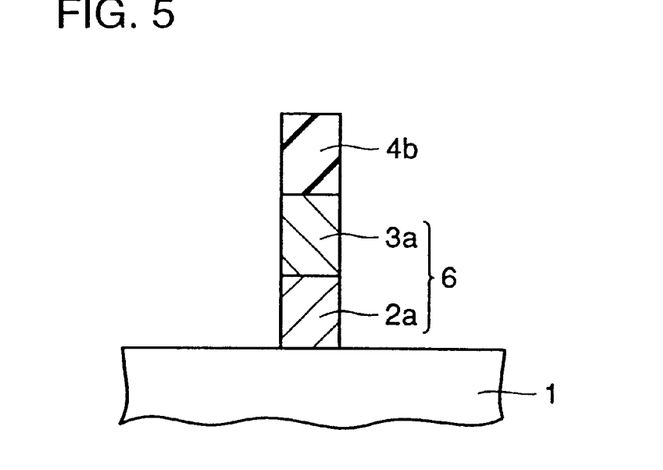

Next, referring to FIG. 4, photoresist pattern 5 covering hard mask 4b is removed. Then, as shown in FIG. 5, by anisotropically etching tungsten silicide film 3 and polycrystalline silicon film 2 using hard mask 4b as a mask by reactive ion etching using $Cl_2$ gas or HBr with $O_2$ under a pressure of for example at most 1 Pa, an interconnection 6 including polycrystalline silicon film 2a and tungsten silicide film 3a is formed.

Thereafter, hard mask 4b is removed. Thus, fine interconnection 6 is formed. As a result, a semiconductor device having fine interconnection 6 is formed with high dimensional accuracy.

In the above described method of manufacturing the semiconductor device, etching is performed by hydrofluoric acid in the gas phase in the step shown in conjunction with FIG. 3. When the dimension of photoresist pattern 5 is at most 0.3 μm, wet etching in a liquid phase such as a hydrofluoric acid (HF) solution may cause insulating film 4a to come off silicon substrate 1.

In the present embodiment, since etching is performed by using the gas phase hydrofluoric acid as hydrofluoric acid, insulating film 4a is prevented from coming off. In the gas phase hydrofluoric acid ambient, insulating film 4a can be more selectively etched as compared with etching of tungsten silicide film 3 or the photoresist pattern, and the dimension of hard mask 4b can be precisely controlled in an unit of about 0.001 μm.

In addition, as the upper surface of insulating film 4a is covered by photoresist pattern 5, only the dimension of hard mask 4b can be controlled without causing any variation in thickness.

It is noted that, in the present embodiment, an interconnection of a polycide structure including polycrystalline silicon film 2a and tungsten silicide film 3a has been described by way of example as interconnection 6, the method of manufacturing the semiconductor device can also be applied to an interconnection including a metal film such as a tungsten film or that including only a polycrystalline silicon film.

Further, although the silicon oxide film is used as the layer to be hard mask 4b in the present embodiment, a silicon nitride film may also be applied. When the silicon nitride film is applied, in the step shown in conjunction with FIG. 3, by etching insulating film 4a in a plasma ambient using a mixture gas of $CF_4$, $O_2$ and $N_2$, etching can be performed with high selectivity along the main surface of silicon substrate 1 with respect to underlying tungsten silicide film 3.

Further, in the step shown in conjunction with FIG. 2, a fluorocarbon based polymer film (not shown) is formed on the exposed side surface insulating film 4a. In the step shown in conjunction with FIG. 3, by etching insulating film 4a in a gas phase hydrofluoric acid ambient under a pressure of several kPa to several tens of kPa, particularly, the polymer film can uniformly be removed. As a result, hard mask 4b can be formed with higher dimensional accuracy. It is noted that the etching of the polymer film will be described in greater detail in the second embodiment section.

Second Embodiment

In the first embodiment, photoresist pattern 5 is directly formed on insulating film 4 including the silicon oxide film, as shown in FIG. 1 or the like. If a design rule decreases to at most 0.3 μm, it becomes difficult to accurately patterning the photoresist pattern on the silicon oxide film due to lithography characteristic.

To avoid the above mentioned problem, in most cases, an anti-reflection film (ARC) is applied. In the second embodiment, a method of manufacturing the semiconductor device with application of the anti-reflection film will be described. In the present embodiment, an inorganic anti-reflection film such as a plasma nitride film is particularly described by way of example.

Figure 6:
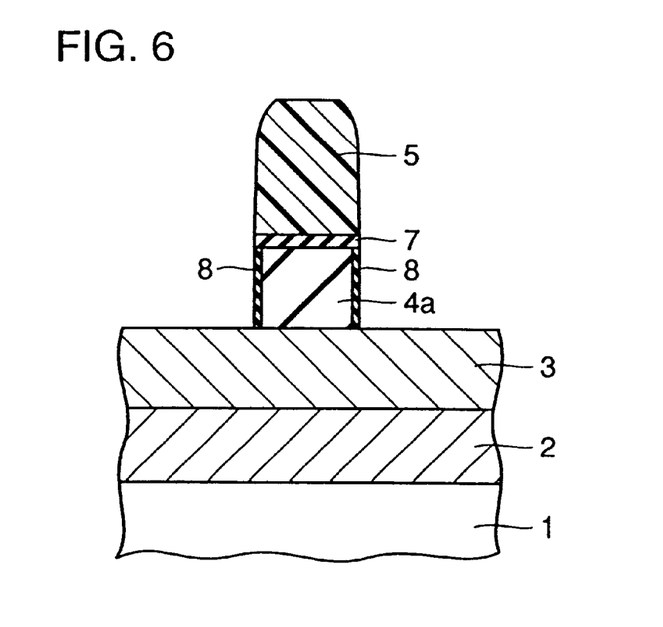
FIG. 6 is a cross sectional view shown in conjunction with a step of a method of manufacturing a semiconductor device according to the second embodiment of the present invention.

First, in the step shown in conjunction with FIG. 1 of the first embodiment, an anti-reflection film 7 (not shown) such as a silicon nitride film is formed after insulating film 4 is formed. Thereafter, as shown in FIG. 6, a photoresist is applied onto anti-reflection film 7 and a desired photoresist pattern 5 is formed.

By anisotropically etching anti-reflection film 7 and insulating film 4 using photoresist pattern 5 as a mask, the surface of tungsten silicide film 3 is exposed and insulating film 4a is formed. At the time, as described in the first embodiment, a fluorocarbon based polymer film 8 is formed on the exposed side surface of insulating film 4a.

Figure 7:
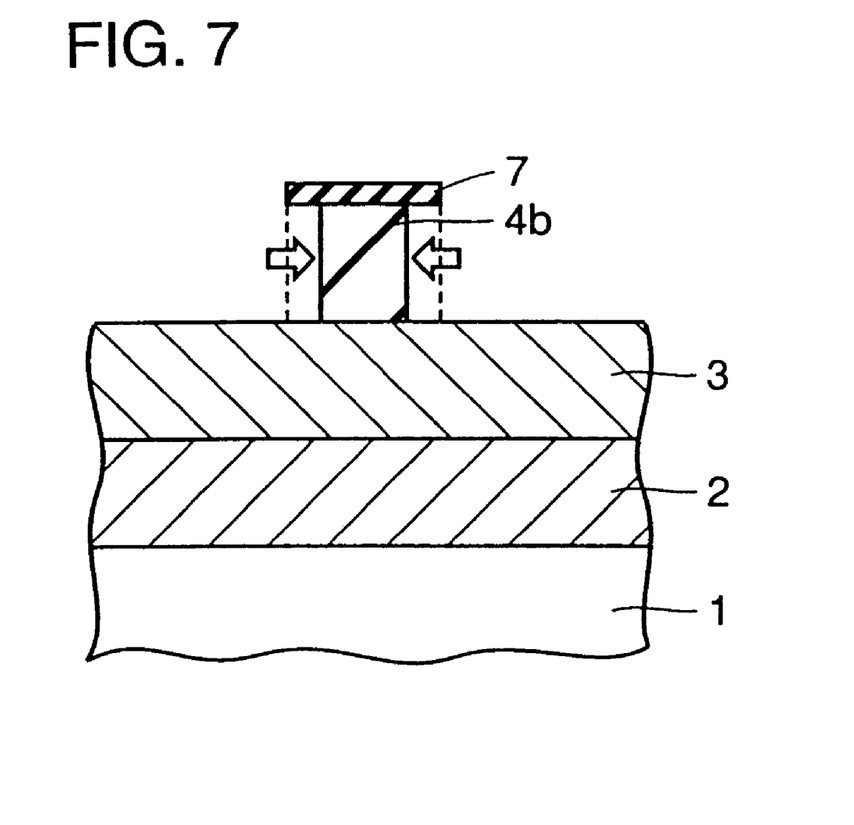
FIG. 7 is a cross sectional view shown in conjunction with a step performed after the step shown in FIG. 6 in the second embodiment of the present invention.

Then, as shown in FIG. 7, photoresist pattern 5 positioned on anti-reflection film 7 is removed. By etching insulating film 4a using anti-reflection film 7 as a mask in a gas phase hydrofluoric acid ambient, hard mask 4b is formed. It is noted that, polymer film 8 is uniformly removed if a pressure of the gas phase hydrofluoric acid ambient is set in a range of several kPa to several tens of kPa.

Subsequently, anti-reflection film 7 is removed by wet etching or dry etching. By anisotropically etching tungsten silicide film 3 and polycrystalline silicon film 2 using hard mask 4b as a mask, an interconnection 6 including polycrystalline silicon film 2a and tungsten silicide film 3a is formed as shown in FIG. 5 shown in conjunction with the first embodiment.

Thereafter, hard mask 4b is removed to provide fine interconnection 6. Thus, a semiconductor device having fine interconnection 6 with high dimensional accuracy is formed.

In the above described method of manufacturing the semiconductor device, halation during exposure is prevented by use of the anti-reflection film to form finer photoresist pattern 5, so that hard mask 4b with higher dimensional accuracy can be formed.

Figure 9:
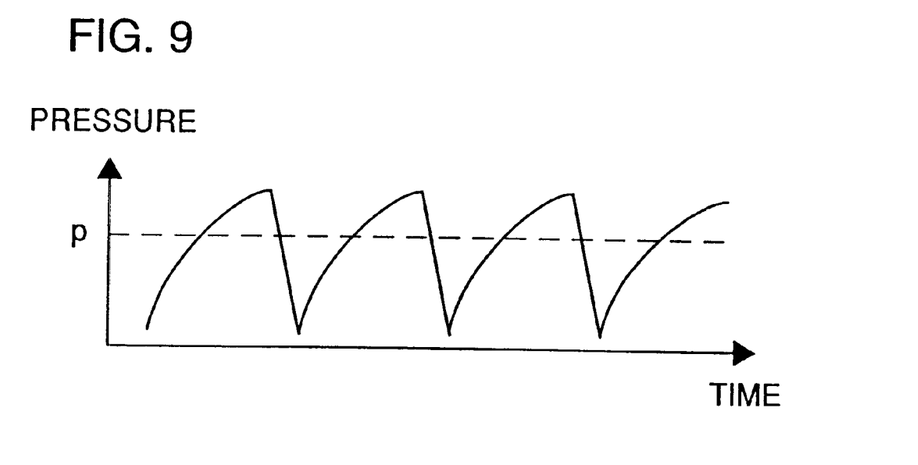
Figure 10:
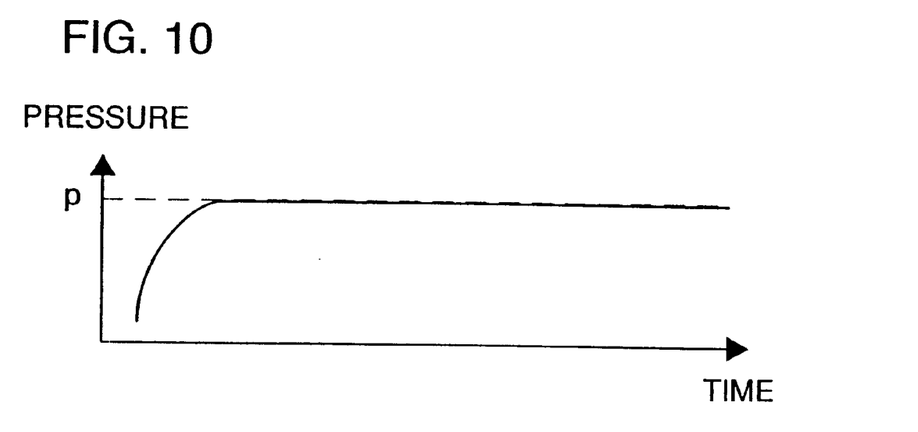

The step shown in conjunction with FIG. 7 has been described as performing etching with a pressure of the gas phase hydrofluoric acid ambient being maintained at several kPa to several tens of kPa. In this case, three patterns of relationships between the pressure and the etching time can be obtained for example as shown in FIGS. 8 to 10.

Figure 8:
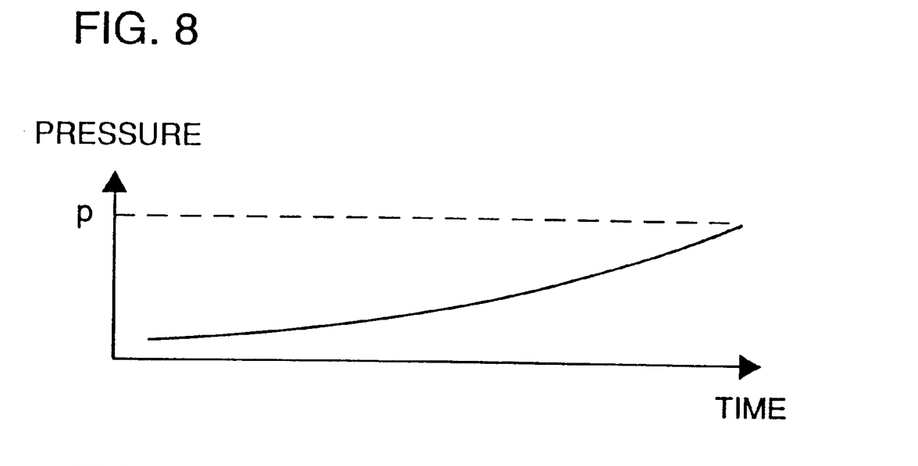
FIGS. 8 to 10 are diagrams respectively showing the first to third patterns each relating to a pressure during etching and an etching time in the step shown in conjunction with FIG. 7 in the second embodiment of the present invention.

Referring to the first pattern shown in FIG. 8, the pressure gradually increases over the etching time. Referring to the second pattern shown in FIG. 9, the pressure changes in a serrated form over the etching time. Referring to the third pattern shown in FIG. 10, the pressure increases at the start of etching and then maintained at a constant value. A maximum pressure p corresponds to the above mentioned pressure of the gas phase hydrofluoric acid in the first and third patterns, whereas a pressure p, i.e., average pressure overtime, corresponds to that in the second pattern.

Appropriate selection of the etching pattern enables the hard mask with higher dimensional accuracy to be readily formed.

It is noted that, in the step shown in conjunction with FIG. 7, when the silicon oxynitride film is applied as anti-reflection film 7, anti-reflection film 7 can be removed by wet etching using a solution including thermal phosphoric acid with a small amount of hydrofluoric acid. If a gas including $CHF_3$, $CF_4$, Ar and $O_2$ is used, anti-reflection film 7 can be removed by dry etching. Further, in the method using dry etching, an anti-reflection film including a silicon nitride film can be removed.

Third Embodiment

A method of manufacturing a semiconductor device according to the third embodiment of the present invention will be described. In the above described first and second embodiments, etching must be performed twice to form hard mask 4b. In the present embodiment, a method of forming a hard mask only by one etching will be described.

First, in the step shown in conjunction with FIG. 1 which has been described in the first embodiment, an insulating film 4 with a prescribed thickness is formed on tungsten silicide film 3. A photoresist pattern 5 is formed on insulating film 4. It is noted that the prescribed thickness of insulating film 4 will later be described.

Figure 11:
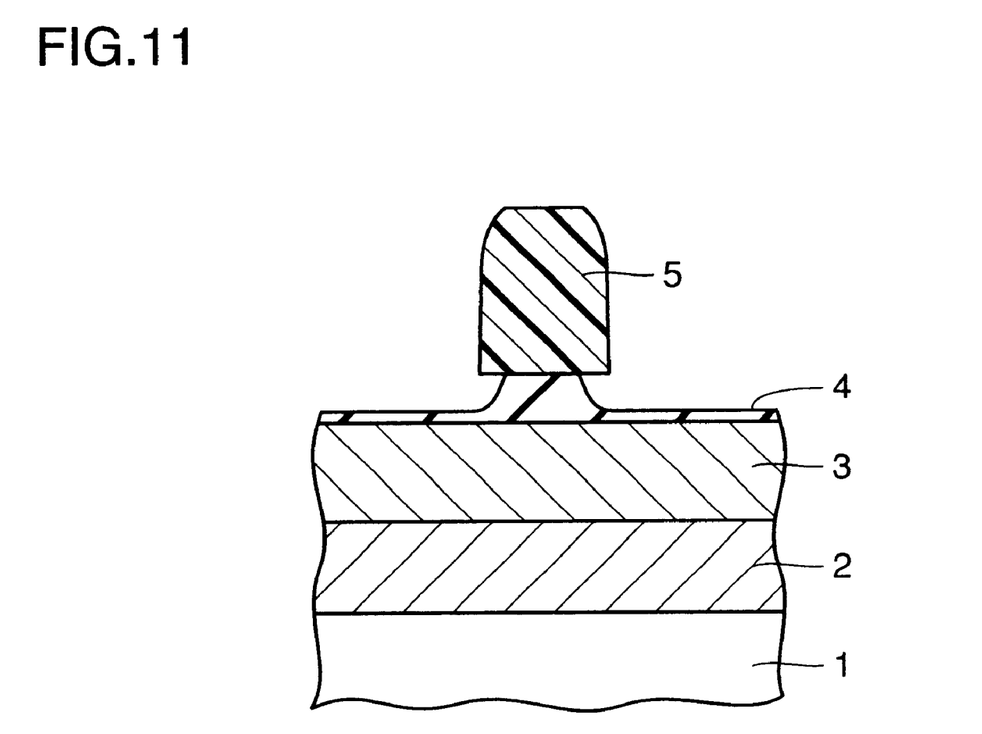
FIG. 11 is a cross sectional view shown in conjunction with a step of a method of manufacturing a semiconductor device according to the third embodiment of the present invention.
Figure 12:
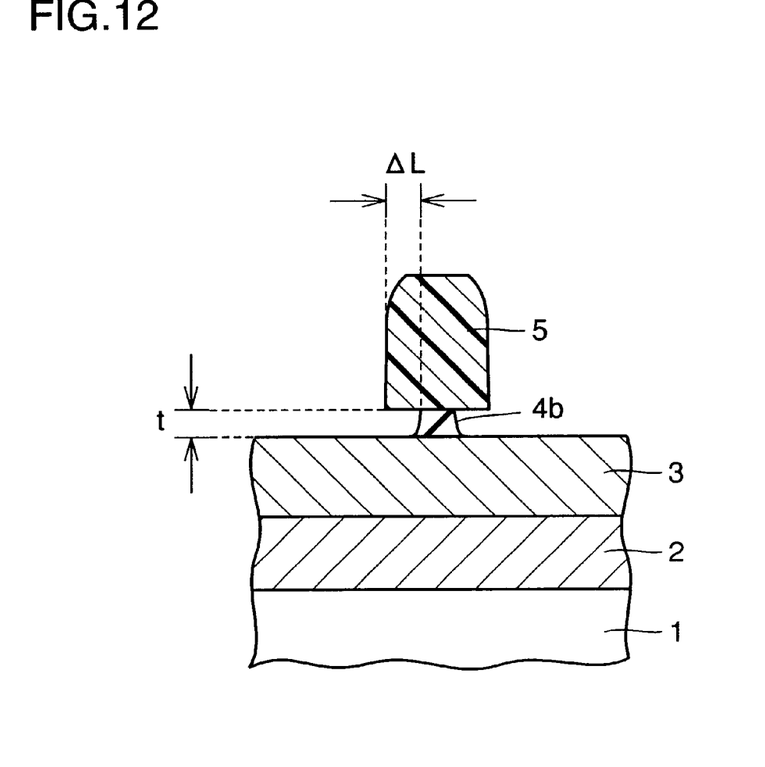
FIG. 12 is a cross sectional view shown in conjunction with a step performed after the step shown in FIG. 11 in the third embodiment of the present invention.

Then, as shown in FIG. 11, insulating film 4 is isotropically etched using photoresist pattern 5 as a mask in a gas phase hydrofluoric acid ambient. At the time, as the insulating film is isotropically etched, a hard mask 4b is formed under photoresist pattern 5 as shown in FIG. 12.

Then, to form hard mask 4b, a thickness t of silicon oxide film 4 must be smaller than a length ΔL (on one side) over which insulating film 4 under photoresist pattern 5 is etched along the main surface of silicon substrate 1.

Thereafter, photoresist pattern 5 is removed, and tungsten silicide film 3 and polycrystalline silicon film 2 are anisotropically etched using hard mask 4b as a mask, so that a desired interconnection (not shown) is formed. Thus, a semiconductor device having a fine interconnection is formed.

In the above described method of manufacturing the semiconductor device, the thickness of insulating film 4 is smaller than length ΔL (on one side) over which insulating film 4 under photoresist pattern 5 is etched along the main surface of silicon substrate 1, so that only one isotropic etching enables formation of hard mask 4b, thereby reducing the number of steps.

In addition, each of the above embodiments has been described as forming the interconnection, the application of the above described hard mask can also be used for formation of other fine patterns to facilitate formation of patterns with high dimensional accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
   forming a prescribed layer on a main surface of a semiconductor substrate;
   forming a first layer to be a mask material used for patterning said prescribed layer on said prescribed layer;
   forming a photoresist pattern on said first layer;
   forming said mask material, including the steps of
      etching said first layer using said photoresist pattern as a mask to form said mask material, thereafter,
      etching said mask material in a gas phase ambient using said photoresist pattern as said mask so as to substantially reduce the width of said mask material; and
   etching said prescribed layer using said mask material as said mask to form a prescribed pattern.

2. The method of manufacturing the semiconductor device according to claim 1, wherein said first layer includes a silicon oxide film, and said gas phase ambient includes a gas phase hydrofluoric acid (HF).

3. The method of manufacturing the semiconductor device according to claim 1, wherein said prescribed layer is a conductive layer, and said prescribed pattern includes an interconnection.

4. The method of manufacturing the semiconductor device according to claim 1, further including the step of removing the photoresist pattern before the step of etching said prescribed layer using said mask material as said mask to form a prescribed pattern.

5. The method of manufacturing the semiconductor device according to claim 1, further including the step of removing the mask material after the prescribed pattern is formed.

6. The method of manufacturing the semiconductor device according to claim 1, wherein said step of forming said mask material includes the step of etching a layer to serve as said mask material so that a width across the entire thickness of the mask material is less than the width of the bottom surface of the photoresist pattern.

7. The method of manufacturing the semiconductor device according to claim 1, wherein the etching of said mask material in the gas phase ambient, entire side surfaces of the mask material exposed by the etching of said first layer are laterally etched.

8. The method of manufacturing the semiconductor device according to claim 1, wherein a thickness of said first layer is smaller than a length over which said first layer is etched along a main surface of said semiconductor substrate in said step of forming said mask material, and said step of forming said mask material include the step of forming said mask material by isotropically etching in said gas phase ambient.

9. The method of manufacturing the semiconductor device according to claim 8, wherein said first layer includes a silicon oxide film, and said gas phase ambient includes a gas phase hydrofluoric acid (HF).

10. The method of manufacturing the semiconductor device according to claim 1, wherein said step of forming said mask material includes the first etching step anisotropically etching said first layer using said photoresist pattern as a mask to expose a surface of said prescribed layer, and
   the second etching step etching a side surface of said mask material positioned under said photoresist pattern to form said mask material, said side surface exposed by said first etching step in said gas phase ambient.

11. The method of manufacturing the semiconductor device according to claim 10, wherein said first layer is a silicon nitride film, and said second etching step makes a gas including $CF_4$, $O_2$ and $N_2$ into a plasma and is performed in said plasma ambient.

12. The method of manufacturing the semiconductor device according to claim 10, wherein said first layer includes a silicon oxide film, and said gas phase ambient includes a gas phase hydrofluoric acid (HF).

13. The method of manufacturing the semiconductor device according to claim 10, wherein said step of forming said photoresist pattern includes the step of forming an anti-reflection film as an underlying film, and said second etching step includes the step of etching said exposed side surface using said anti-reflection film as a mask.

14. The method of manufacturing the semiconductor device according to claim 13, wherein said first layer is a silicon nitride film, and said second etching step makes a gas including $CF_4$, $O_2$ and $N_2$ into a plasma and is performed in said plasma ambient.

15. The method of manufacturing the semiconductor device according to claim 13, wherein said first layer includes a silicon oxide film, and said gas phase ambient includes a gas phase hydrofluoric acid (HF).

16. The method of manufacturing the semiconductor device according to claim 10, wherein said second etching step includes the step of removing a polymer film formed on said side surface in said first-etching step.

17. The method of manufacturing the semiconductor device according to claim 16, wherein said step of forming said photoresist pattern includes the step of forming an anti-reflection film as an underlying film, and said second etching step includes the step of etching said exposed side surface using said anti-reflection film as a mask.

18. The method of manufacturing thee semiconductor device according to claim 16, wherein said first layer is a silicon nitride film, and said second etching step makes a gas including $CF_4$, $O_2$ and $N_2$ into a plasma and is performed in said plasma ambient.

19. The method of manufacturing the semiconductor device according to claim 16, wherein said first layer includes a silicon oxide film, and said gas phase ambient includes a gas phase hydrofluoric acid (HF).

* * * * *